United States Patent
Kang et al.

(10) Patent No.: US 9,628,731 B2
(45) Date of Patent: Apr. 18, 2017

(54) IMAGE CAPTURE APPARATUS

(71) Applicant: VIEWORKS CO., LTD., Gyeonggi-do (KR)

(72) Inventors: Chang Woo Kang, Gyeonggi-do (KR); Gwan Su Lee, Gyeonggi-do (KR)

(73) Assignee: VIEWORKS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/761,528

(22) PCT Filed: Mar. 31, 2014

(86) PCT No.: PCT/KR2014/002717
§ 371 (c)(1),
(2) Date: Jul. 16, 2015

(87) PCT Pub. No.: WO2014/178539
PCT Pub. Date: Nov. 6, 2014

(65) Prior Publication Data
US 2015/0358564 A1     Dec. 10, 2015

(30) Foreign Application Priority Data

Apr. 29, 2013  (KR) .................. 10-2013-0047326

(51) Int. Cl.
| | |
|---|---|
| H04N 5/361 | (2011.01) |
| H04N 5/225 | (2006.01) |
| H04N 5/369 | (2011.01) |
| H04N 5/217 | (2011.01) |
| H01L 23/36 | (2006.01) |
| H01L 23/38 | (2006.01) |
| H04N 5/232 | (2006.01) |
| H01L 27/146 | (2006.01) |
| H01L 23/42 | (2006.01) |
| H01L 23/427 | (2006.01) |

(52) U.S. Cl.
CPC ............ *H04N 5/361* (2013.01); *H01L 23/36* (2013.01); *H01L 23/38* (2013.01);
(Continued)

(58) Field of Classification Search
CPC ...... H04N 5/361; H04N 5/369; H04N 5/2252; H04N 5/2176; H04N 5/2253; H01L 23/38;
(Continued)

(56) References Cited

U.S. PATENT DOCUMENTS

| | | |
|---|---|---|
| 5,213,152 A | 5/1993 | Cox |
| 5,453,618 A | 9/1995 | Sutton et al. |

(Continued)

FOREIGN PATENT DOCUMENTS

| | | |
|---|---|---|
| JP | 2004120583 A | 4/2004 |
| JP | 2008-219610 A | 9/2008 |

(Continued)

OTHER PUBLICATIONS

Office Action dated Feb. 21, 2014 in Korean Application No. 10-2013-0047326.
(Continued)

*Primary Examiner* — Gevell Selby
(74) *Attorney, Agent, or Firm* — Saliwanchik, Lloyd & Eisenschenk

(57) ABSTRACT

Disclosed herein is an image capture apparatus. The image capture apparatus includes an image sensor, a cooler placed at one side of the image sensor and cooling the image sensor, and a moving device placed at one side of the cooler and moving the image sensor and the cooler.

10 Claims, 3 Drawing Sheets

(52) U.S. Cl.
CPC ..... *H01L 27/14618* (2013.01); *H04N 5/2176* (2013.01); *H04N 5/2252* (2013.01); *H04N 5/2253* (2013.01); *H04N 5/23232* (2013.01); *H04N 5/369* (2013.01); *H01L 23/427* (2013.01); *H01L 2924/0002* (2013.01)

(58) Field of Classification Search
CPC  H01L 23/36; H01L 2924/0002; H01L 23/427
See application file for complete search history.

(56) References Cited

U.S. PATENT DOCUMENTS

| | | | |
|---|---|---|---|
| 6,307,590 B1* | 10/2001 | Yoshida | H04N 5/2252 348/340 |
| 2004/0075870 A1* | 4/2004 | Karaki | H04N 5/349 358/296 |
| 2014/0055671 A1* | 2/2014 | Kawamura | H04N 5/2252 348/374 |

FOREIGN PATENT DOCUMENTS

| | | |
|---|---|---|
| JP | 2008271487 A | 11/2008 |
| JP | 2013051635 A | 3/2013 |
| KR | 10-2006-0045565 A | 5/2006 |
| KR | 10-2006-0071159 A | 6/2006 |
| KR | 10-2008-0073072 A | 8/2008 |

OTHER PUBLICATIONS

International Search Report in International Application No. PCT/KR2014/002717, filed Mar. 31, 2014.

Office Action dated Aug. 9, 2016 in Japanese Application No. 2015550341.

Office Action dates Oct. 27, 2015 in Taiwanese Application No. 103113634.

* cited by examiner

IMAGE CAPTURE APPARATUS

CROSS-REFERENCE TO RELATED APPLICATIONS

This application is the U.S. national stage application of International Patent Application No. PCT/KR2014/002717, filed Mar. 31, 2014, which claims priority of Korean Application No. 10-2013-0047326, filed Apr. 29, 2013, the disclosures of which are incorporated herein by reference in their entirety.

BACKGROUND

Technical Field

The present invention relates to an image capture apparatus, and more particularly, to an image capture apparatus which can achieve a high resolution and reduce noise of an image sensor.

Description of the Related Art

In general, an image capture apparatus refers to an apparatus for photographing an object. The image capture apparatus is applicable to inspection devices, imaging devices, communication devices, and various similar devices. For example, the image capture apparatus may be applied to an inspection device for displays, an inspection device for semiconductor devices, an inspection device for printed circuit boards, an inspection device for solar panels, etc. The image capture apparatus photographs an inspection target, and an inspection device reads the photographed image and determines whether the target is defective.

A background technique of the present invention is disclosed in Korean Patent Publication No. 2006-0045565, published on May 17, 2006 and entitled "Lens barrel combining apparatus for camera module and combining method using the same."

A typical image capture apparatus photographs an object with an image sensor placed in a stationary state, it is difficult to capture an image having a higher resolution than the resolution of the image sensor in the image capture apparatus. In addition, since the image sensor generates heat and makes noise, there can be a problem of deterioration in image quality in the case of products required to make less noise. Therefore, there is a need for an image capture apparatus that overcomes such problems.

BRIEF SUMMARY

The present invention is conceived to solve such problems in the related art, and an aspect of the present invention is to provide an image capture apparatus, which can capture an image having a higher resolution than that that of an image sensor and can reduce noise of the image sensor.

In accordance with one aspect of the present invention, an image capture apparatus includes: an image sensor; a cooler placed at one side of the image sensor and cooling the image sensor; and a moving device placed at one side of the cooler and moving the image sensor and the cooler.

The cooler may include a thermoelectric module including a cooling portion and a heating portion, and the cooling portion may be placed at the one side of the image sensor.

The cooling portion may contact the image sensor and cool the image sensor.

The image capture apparatus may further include a heat dissipating portion placed at one side of the heating portion and cooling the heating portion.

The heat dissipating portion may include a heat pipe.

The moving device may include a coupler placed at one side of the thermoelectric module; and a drive unit coupled to the coupler and moving the coupler.

The drive unit may move the image sensor in units of 1/n pixels, where n refers to the number of moving times required to move the image sensor as much as a length of one pixel, assuming that one pixel has a length of 1.

In accordance with another aspect of the present invention, an image capture apparatus includes: a first housing; an image sensor received in the first housing; a cooler placed at one side of the image sensor and cooling the image sensor; a second housing adjoining the first housing; and a moving device placed inside the second housing and connected to the first housing to move the first housing.

The cooler may include a thermoelectric module including a cooling portion and a heating portion, and the cooling portion may be placed at the one side of the image sensor.

The cooling portion may contact the image sensor and cool the image sensor, and the heating portion may contact the first housing.

The image capture apparatus may further include a heat dissipating portion placed in the second housing and cooling the heating portion.

The heat dissipating portion may include a heat pipe.

The moving device may include: a coupler connected to the first housing; and a drive unit placed inside the second housing, and coupled to the coupler and moving the coupler.

The drive unit may move the image sensor in units of 1/n pixels, where n refers to the number of moving times required to move the image sensor as much as a length of one pixel, assuming that one pixel has a length of 1.

The image capture apparatus may further include a heat sink that contacts the second housing and cools the second housing.

According to the present invention, the image capture apparatus can capture an image while cooling an image sensor and moving a pixel array, thereby providing a high resolution while reducing noise of the image sensor.

BRIEF DESCRIPTION OF THE DRAWINGS

The above and other aspects, features and advantages of the present invention will become apparent from the following description of embodiments given in conjunction with the accompanying drawings, in which.

DETAILED DESCRIPTION

Hereinafter, embodiments of the present invention will now be described in detail with reference to the accompanying drawings. It should be noted that the drawings are not to precise scale and may be exaggerated in thickness of lines or size of components for descriptive convenience and clarity only. Furthermore, the terms used herein are defined by taking functions of the present invention into account and can be changed according to user or operator's custom or intention. Therefore, definition of the terms should be made according to the overall disclosure set forth herein.

Figure 1:
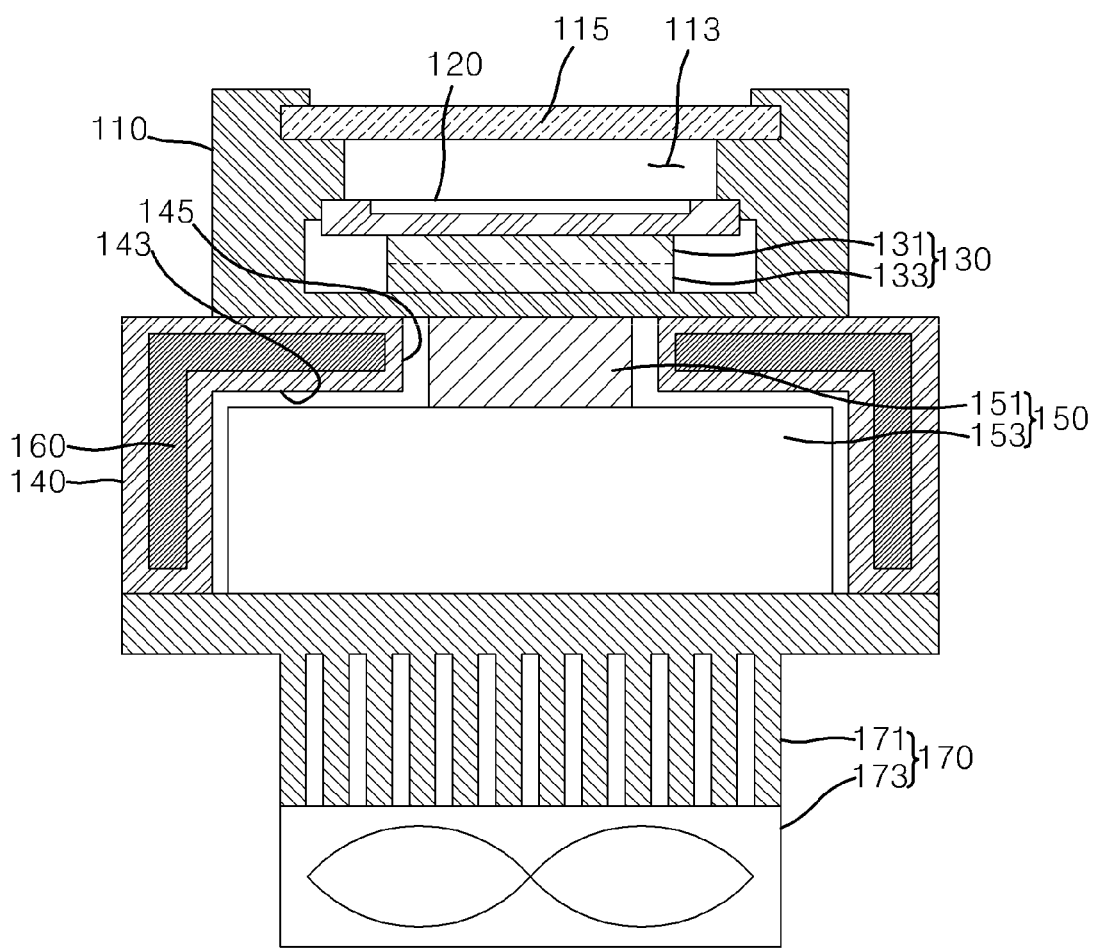
FIG. 1 is a cross-sectional view of an image capture apparatus according to one embodiment of the present invention.

FIG. 1 is a cross-sectional view of an image capture apparatus according to one embodiment of the present invention.

Referring to FIG. 1, an image capture apparatus according to one embodiment of the present invention includes an image sensor 120, a cooler 130, and a moving device 150.

The image sensor 120 is mounted on a printed circuit board (not shown). Here, the image sensor 120 may be attached to one surface of the printed circuit board. In addition, when the printed circuit board is formed with an opening, the image sensor 120 may be placed on a circumference of the opening. In this way, the image sensor 120 may be mounted on the printed circuit board in various forms.

Circuit wiring of the image sensor 120 and circuit wiring of the printed circuit board are connected to each other. The printed circuit board is connected to a controller (not shown) of the image capture apparatus. Information about an image photographed by the image sensor 120 is transmitted to the controller through the printed circuit board.

The cooler 130 is places at one side (a lower side in FIG. 1) of the image sensor 120 and cools the image sensor 120. The cooler 130 may be applied in various forms so long as the cooler can cool the image sensor 120. Hereinafter, one embodiment of the cooler 130 will be described by way of example.

The cooler 130 may be a thermoelectric module, such as a Peltier element, which includes a cooling portion 131 and a heating portion 133. When direct current (DC) voltage is applied to opposite ends of two different elements that constitute the thermoelectric module, one side of the thermoelectric module is cooled and the other side of the thermoelectric module generates heat. Thus, in use, the thermoelectric module advantageously allows selective cooling of a necessary portion. In this embodiment, the one side (an upper side in FIG. 1) of the thermoelectric module will be defined as the cooling portion 131, and the other side (a lower side in FIG. 1) of the thermoelectric module will be defined as the heating portion 133.

The cooling portion 131 of the thermoelectric module is placed at one side of the image sensor 120 and cools the image sensor 120 when the image sensor 120 generates heat. The cooling portion 131 may directly contact the image sensor 120 or indirectly contact the image sensor 120 via a thermally conductive medium. Here, the thermal-conductive medium may be a metal or an alloy having good thermal conductivity, or a thermal-conductive fluid, such as grease. As such, the expression "contact between the cooling portion 131 and the image sensor 120" means both direct contact and indirect conduct therebetween.

Since the image sensor 120 is cooled by the cooler 130, the image sensor 120 can reduce dark current noise. The dark current noise refers to a signal value of a thermion generated by heat from the image sensor 120 even though no light enters the image sensor 120. The dark current noise decreases a dynamic range of the image sensor 120, thereby deteriorating performance of the image capture apparatus. The dynamic range refers to a ratio of brightest region to darkest region in an image, and is an index indicating capabilities of including both dark and bright regions in one image.

The image sensor 120 and the cooler 130 are placed inside a first housing 110. The first housing 110 is formed with an accommodating space 113 to accommodate the image sensor 120 and the cooler 130 therein. Here, the cooling portion 131 of the cooler 130 is disposed to contact the image sensor 120.

In addition, the heating portion 133 of the cooler 130 may directly contact a bottom of the first housing 110 or indirectly contact the bottom of the first housing 110 via a thermally conductive medium. Here, contact between the heating portion 133 and the first housing 110 means both direct contact and indirect conduct therebetween.

The first housing 110 may be made of a thermally conductive material so as to dissipate heat of the heating portion 133. The thermally conductive material may form the entirety or only part of the first housing 110. In this way, since the first housing 110 is made of the thermally conductive material, the heating portion 133 has a large heat dissipation area. As the heating portion 133 has improved heat dissipating performance, the cooling portion 131 also has improved cooling performance. Further, since heat generated from the image sensor 120 is transferred to the cooling portion 131 and discharged outside through the heating portion 133, the improved heat dissipating performance of the heating portion 133 enhances not only cooling performance of the cooling portion 131, but also efficiency of cooling the image sensor 120.

The first housing 110 is provided with a stationary glass plate 115 to receive incident light. The glass plate 115 prevents foreign matter from being introduced into the first housing 110, thereby preventing the image sensor 120 from being contaminated by foreign matter.

The moving device 150 is placed at one side (the lower side in FIG. 1) of the cooler 130. The moving device 150 moves the image sensor 120 and the cooler 130. In this embodiment, the moving device 150 moves the first housing 110 to move the image sensor 120 and the cooler 130 received in the first housing 110. The moving device 150 includes a coupler 151 and a drive unit 153.

The coupler 151 is a medium for transferring driving force of the drive unit 153 to the cooler 130 and the image sensor 120. The coupler 151 is connected to one side of the first housing 110. Here, one surface of the coupler 151 may be coupled to one surface of the first housing 110 by an adhesive or a fastening member.

The drive unit 153 is coupled to the coupler 151 and moves the coupler 151 by driving force. The drive unit 153 moves the first housing 110 in units of 1/n pixels, whereby the image sensor 120 can be very minutely moved in units of 1/n pixels. Thus, the image sensor 120 can capture an image while moving in units of 1/n pixels along X and Y axes, and combines a plurality of captured images through software, thereby providing one final image.

Herein, n refers to the number of moving times required to move the image sensor 120 as much as a length of one pixel, assuming that one pixel has a length of 1. For example, in FIG. 3, the drive unit 153 may move the image sensor 120 in units of 0.5 pixels. The image sensor 120 captures images while moving, and the controller combines the captured images and outputs a combined image, thereby improving resolution of the output final image. This operation will be described in more detail hereinafter.

The drive unit 153 moves the coupler 151 along two axes. For example, the drive unit 153 moves the coupler 151 in directions of X and Y axes. Therefore, the image sensor 120 can move in units of 1/n pixels along the X and Y axes.

The drive unit 153 may include a plurality of piezoelectric elements connected to the coupler 151. When voltage is applied to the piezoelectric elements, the piezoelectric elements are changed in shape, and thus, the coupler 151 and the image sensor 120 are moved.

The drive unit 153 may have a structure in which four panels are stacked one above another and one panel is moved by the piezoelectric element. The drive unit 153 may have any structure so long as it can move the image sensor 120. The drive unit 153 is a nano-stage which extremely minutely moves the image sensor 120.

In this embodiment, the image capture apparatus further includes a heat dissipating portion 160 connected to the heating portion 133 of the cooler 130 and cooling the heating portion 133. The heat dissipating portion 160 may directly contact the heating portion 133 or indirectly contact the heating portion 133 via a thermally conductive medium. The heat dissipating portion 160 may be a heat pipe, in which a thermally conductive fluid flows inside a pipe body (not shown). The heat pipe quickly dissipates heat of the heating portion 133 through heat exchange by the flow of the thermally conductive fluid. As such, when there is a long distance or an obstacle between the heating portion 133 and a cooling unit for cooling the heating portion 133, the heat pipe can dissipate heat to the outside while minimizing difference in temperature between the heating portion 133 and the cooling unit. Therefore, improved heat dissipating performance of the heating portion 133 enhances cooling performance of the cooling portion 131, thereby improving efficiency of cooling the image sensor 120.

The heat dissipating portion 160 may be placed in the second housing 140. The heat dissipating portion 160 may be formed in various shapes, such as an I-shape, L-shape, and the like, in the second housing 140.

The second housing 140 adjoins one surface of the first housing 110. The one surface of the second housing 140 may be smooth such that one surface of the first housing 110 can smoothly slide thereon. Grease may be provided to the one surface of second housing 140 so as to allow the first housing 110 to smoothly slide and to improve efficiency of heat exchange.

The moving device 150 is placed in an inner space 143 of the second housing 140. The second housing 140 is formed with an opening 145 through which the coupler 151 can be inserted. The opening 145 is larger than the coupler 151 such that the coupler 151 can be moved by the drive unit 153.

The second housing 140 is made of a thermally conductive material so as to dissipate heat of the heat dissipating portion 160. The thermally conductive material may form the entirety or only part of the second housing 140. In this way, since the heating portion 133 is connected to the second housing 140 through the first housing 110, the heat dissipation area of the heating portion 133 is further increased by the second housing 140. Therefore, performance for cooling the image sensor 120 is also further improved.

In this embodiment, the image capture apparatus may further include a heat sink 170, which contacts the second housing 140 and cools the second housing 140. The heat sink 170 includes heat exchange fins 171 contacting the second housing 140, and a fan 173 to blow air to the heat exchange fins 171. The heat exchange fins 171 increase the heat dissipation area of the second housing 140, and the fan 173 causes forced convection, thereby achieving more effective heat dissipation. The heat exchange fins 171 may be formed in various shapes. Since the heat sink 170 improves heat dissipation of the second housing 140, performance of cooling the image sensor 120 is further enhanced.

Next, operation of the image capture apparatus with the foregoing configuration according to the embodiment of the invention will be described hereinafter. In the following description, the image sensor will be illustrated as moving in units of 0.5 pixels.

Figure 2:
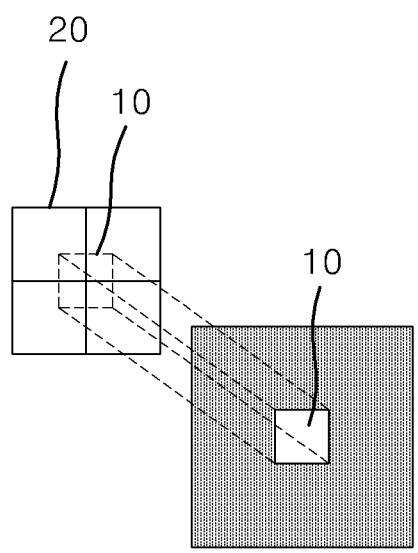
FIG. 2 shows an object image and a pixel array of the image capture apparatus of FIG. 1.
Figure 3:
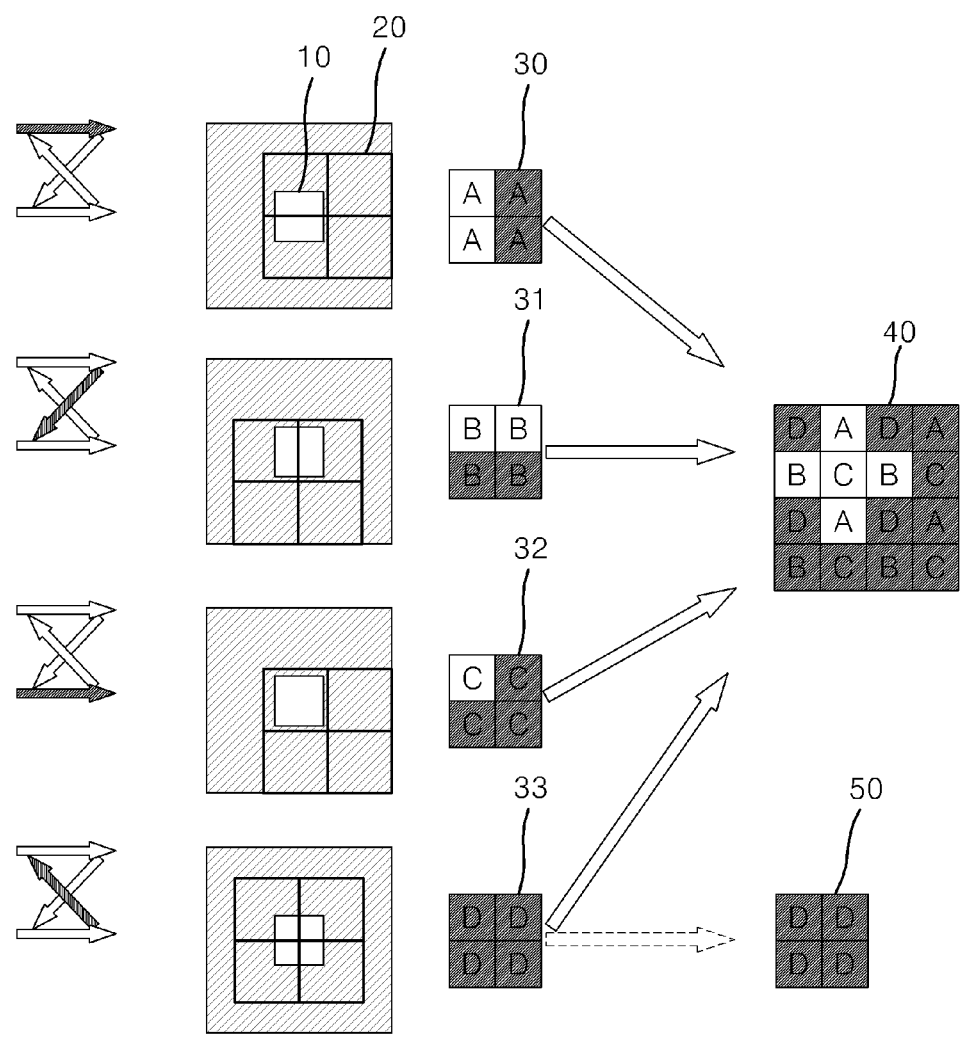
FIG. 3 shows a photographing method of the image capture apparatus of FIG. 1.

FIG. 2 shows an object image and a pixel array of the image capture apparatus of FIG. 1, and FIG. 3 shows a photographing method of the image capture apparatus of FIG. 1.

Referring to FIGS. 2 and 3, an image 10 of an object is projected on a pixel array 20. The moving device 150 allows the image capture apparatus to capture the image while moving the pixel array 20, which will be described below in detail.

As the moving device 150 is operated, the image sensor 120 is moved in a direction of the X axis (a rightward direction in FIG. 3) as much as 0.5 pixels. At this position, the image sensor 120 captures an image of the object (i.e., image A (the uppermost image) in FIG. 3). A photographed first output image 30 is stored in a storage (not shown).

As the moving device 150 is operated, the image sensor 120 is moved in a diagonal direction. At this time, the image sensor 120 is moved along the X axis as much as 0.5 pixels and is moved along the Y axis as much as 0.5 pixels, resulting in movement in the diagonal direction (a direction toward a left lower side in FIG. 3). At this position, the image sensor 120 captures an image of the object (i.e., image B (the second image from the top) in FIG. 3). A photographed second output image 31 is stored in the storage.

As the moving device 150 is operated, the image sensor 120 is moved in a direction of the X axis (the rightward direction in FIG. 3) as much as 0.5 pixels. At this position, the image sensor 120 captures an image of the object (i.e., image C (the third image from the top) in FIG. 3). A photographed third output image 32 is stored in a storage.

As the moving device 150 is operated, the image sensor 120 is moved in a diagonal direction. At this time, the image sensor 120 is moved along the X axis as much as 0.5 pixels and is moved along the Y axis as much as 0.5 pixels, resulting in movement in the diagonal direction (a direction toward a left upper side in FIG. 3). At this position, the image sensor 120 captures an image of the object (i.e., image D (the fourth image from the top) in FIG. 3). A photographed fourth output image 33 is stored in the storage.

The controller combines the first to fourth output images 30, 31, 32, 33 and outputs a final image 40. The final image 40 is an image finally obtained by combining the four output images 30, 31, 32, 33, which has a higher resolution than a final image 50 based only on a single output image. Therefore, the image capture apparatus has improved resolution.

The image sensor 120 can generate heat while the image capture apparatus captures an image. At this time, the cooling portion 131 cools the image sensor 120, thereby minimizing emission of thermions from the image sensor 120. Thus, the image sensor 120 can be prevented from generating dark current noise, thereby improving the resolution of the image capture apparatus.

The heating portion 133 is directly and indirectly connected to the first housing 110 and the second housing 140 and thus has an increased heat dissipation area. In addition, the heating portion 133 may dissipate heat through the heat dissipating portion 160. In this way, the first housing 110, the second housing 140 and the heat dissipating portion 160 improve heat dissipation of the heating portion 133, thereby improving performance of the cooling portion 131 in the cooler 130. As a result, the first housing 110, the second housing 140 and the heat dissipating portion 160 also enhance performance of cooling the image sensor 120, thereby minimizing emission of thermions from the image sensor 120.

As such, the image capture apparatus captures an image while cooling the image sensor 120 and moving the pixel array 20, thereby providing a high resolution.

Although some embodiments have been described herein, it should be understood that these embodiments are given by way of illustration only, and that various modifications, variations, and alterations can be made without departing from the spirit and scope of the present invention. The scope of the present invention should be limited only by the accompanying claims and equivalents thereof.

What is claimed is:

1. An image capture apparatus comprising:
an image sensor;
a cooler placed at one side of the image sensor and cooling the image sensor; and
a moving device placed at one side of the cooler and moving the image sensor and the cooler,
wherein the cooler comprises a thermoelectric module comprising a cooling portion and a heating portion, the cooling portion being placed at the one side of the image sensor,
wherein the moving device comprises:
a coupler placed at one side of the thermoelectric module; and
a drive unit coupled to the coupler and moving the coupler,
wherein the drive unit moves the image sensor in units of 1/n pixels (n refers to the number of moving times required to move the image sensor as much as a length of one pixel, assuming that one pixel has a length of 1).

2. The image capture apparatus according to claim 1, wherein the cooling portion contacts the image sensor and cools the image sensor.

3. The image capture apparatus according to claim 1, further comprising:
a heat dissipating portion placed at one side of the heating portion and cooling the heating portion.

4. The image capture apparatus according to claim 3, wherein the heat dissipating portion comprises a heat pipe.

5. An image capture apparatus comprising:
a first housing;
an image sensor received in the first housing;
a cooler placed at one side of the image sensor and cooling the image sensor;
a second housing adjoining the first housing; and
a moving device placed inside the second housing and connected to the first housing to move the first housing,
wherein the moving device comprises:
a coupler connected to the first housing; and
a drive unit placed inside the second housing, and coupled to the coupler and moving the coupler,
wherein the drive unit moves the image sensor in units of 1/n pixels (n refers to the number of moving times required to move the image sensor as much as a length of one pixel, assuming that one pixel has a length of 1).

6. The image capture apparatus according to claim 5, wherein the cooler comprises a thermoelectric module including a cooling portion and a heating portion, the cooling portion being placed at the one side of the image sensor.

7. The image capture apparatus according to claim 6, wherein the cooling portion contacts the image sensor and cools the image sensor, and the heating portion contacts the first housing.

8. The image capture apparatus according to claim 7, further comprising:
a heat dissipating portion placed in the second housing and cooling the heating portion.

9. The image capture apparatus according to claim 8, wherein the heat dissipating portion comprises a heat pipe.

10. The image capture apparatus according to claim 5, further comprising: a heat sink contacting the second housing and cooling the second housing.

* * * * *